United States Patent
Jang

(10) Patent No.: US 10,535,317 B2
(45) Date of Patent: Jan. 14, 2020

(54) SHIFT REGISTER AND DISPLAY DEVICE INCLUDING THE SAME

(71) Applicant: LG DISPLAY CO., LTD., Seoul (KR)

(72) Inventor: YongHo Jang, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 247 days.

(21) Appl. No.: 15/830,625

(22) Filed: Dec. 4, 2017

(65) Prior Publication Data

US 2018/0190233 A1 Jul. 5, 2018

(30) Foreign Application Priority Data

Dec. 30, 2016 (KR) .................. 10-2016-0184501

(51) Int. Cl.
*G11C 19/00* (2006.01)
*G09G 3/36* (2006.01)
*G11C 19/28* (2006.01)

(52) U.S. Cl.
CPC ......... *G09G 3/3677* (2013.01); *G09G 3/3688* (2013.01); *G09G 2310/0281* (2013.01); *G09G 2310/0286* (2013.01); *G09G 2310/08* (2013.01); *G11C 19/28* (2013.01)

(58) Field of Classification Search
None
See application file for complete search history.

(56) References Cited

U.S. PATENT DOCUMENTS

| | | | | |
|---|---|---|---|---|
| 5,744,820 A | * | 4/1998 | Matsushima | H01L 27/12 257/59 |
| 2003/0189542 A1 | * | 10/2003 | Lee | G09G 3/3648 345/93 |
| 2012/0212275 A1 | * | 8/2012 | Jang | G09G 3/3677 327/295 |
| 2013/0010916 A1 | * | 1/2013 | Jang | G09G 3/3677 377/64 |
| 2014/0003571 A1 | * | 1/2014 | Yamamura | G11C 19/28 377/74 |
| 2015/0116008 A1 | * | 4/2015 | Jang | H03K 17/161 327/109 |
| 2017/0004760 A1 | * | 1/2017 | Jang | G09G 3/2092 |
| 2017/0184888 A1 | * | 6/2017 | Sakamoto | G02F 1/1339 |
| 2017/0200420 A1 | * | 7/2017 | No | G06F 13/1689 |
| 2018/0129093 A1 | * | 5/2018 | Hong | G02F 1/1345 |

FOREIGN PATENT DOCUMENTS

| KR | 10-2014-0020391 A | 2/2014 |
|---|---|---|
| KR | 10-2015-0040750 A | 4/2015 |
| KR | 10-2015-0126286 A | 11/2015 |

* cited by examiner

*Primary Examiner* — Tuan T Lam
(74) *Attorney, Agent, or Firm* — Birch, Stewart, Kolasch & Birch, LLP

(57) ABSTRACT

Disclosed are a shift register and a display device including the same, in which a size of a circuit is reduced. The shift register includes a stage outputting a gate shift clock, supplied through a gate shift clock line, as a scan pulse and outputting a carry shift clock, supplied through a carry shift clock line, as a carry pulse. The carry shift clock line overlaps the gate shift clock line.

10 Claims, 6 Drawing Sheets

SHIFT REGISTER AND DISPLAY DEVICE INCLUDING THE SAME

CROSS-REFERENCE TO RELATED APPLICATIONS

This application claims the priority benefit of the Korean Patent Application No. 10-2016-0184501 filed on Dec. 30, 2016 in the Republic of Korea, which is hereby incorporated by reference as if fully set forth herein.

BACKGROUND

Field of the Invention

The present disclosure relates to a shift register and a display device including the same.

Discussion of the Related Art

Recently, with the advancement of multimedia, the importance of display devices is increasing. Therefore, flat panel display devices such as liquid crystal display (LCD) devices, organic light emitting display devices, and light emitting diode display devices are being used practically. The LCD devices and the organic light emitting display devices among the flat panel display devices have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMPs), navigation devices, ultra-mobile personal computers (PCs), mobile phones, smartphones, smartwatches, tablet personal computers (PCs), watch phones, and mobile communication terminals.

The LCD devices and the organic light emitting display devices each include a display panel including a plurality of pixels each including a thin film transistor (TFT) connected to a data line and a gate line, a data driving circuit that supplies a data voltage to the data line, and a gate driving circuit including a shift register that supplies a scan pulse to the gate line.

Recently, display devices having a gate-in panel (GIP) structure where a transistor of the shift register configuring the gate driving circuit is built into a non-display area of the display panel in a TFT type at the same time with a process of forming a TFT of each pixel, are being used in order to simplify the configuration of a circuit component, decrease the manufacturing cost, and reduce a bezel width.

A duty ratio of the scan pulse supplied to the display panel may be appropriately set based on a driving condition, and particularly, if the duty ratio of the scan pulse is low, a low period where the scan pulse is maintained in a low state increases, causing a problem where the scan pulse is not normally output in an output period of a stage. In order to solve such a problem, Korean Patent Publication No. 10-2014-0020391 proposed by the present inventor discloses a shift register that generates a carry pulse by using a carry clock pulse which maintains a high state for a longer time than a scan clock pulse, and turns on a TFT for a sufficient time by using the carry pulse. However, in that shift register, since a separate line for supplying the carry clock pulse is added, a size or an area of a clock line part may increase, which may cause an increase in the bezel width of a display device.

SUMMARY

Accordingly, the present disclosure is directed to provide a shift register and a display device including the same that substantially obviate one or more problems due to limitations and disadvantages of the related art.

An aspect of the present disclosure is directed to provide a shift register and a display device including the same, in which a size of a clock line part is reduced.

Another aspect of the present disclosure is directed to provide a display device having a thin bezel width.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a shift register including a stage outputting a gate shift clock signal, supplied through a gate shift clock line, as a scan pulse and outputting a carry shift clock signal, supplied through a carry shift clock line, as a carry pulse, wherein the carry shift clock line overlaps the gate shift clock line.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
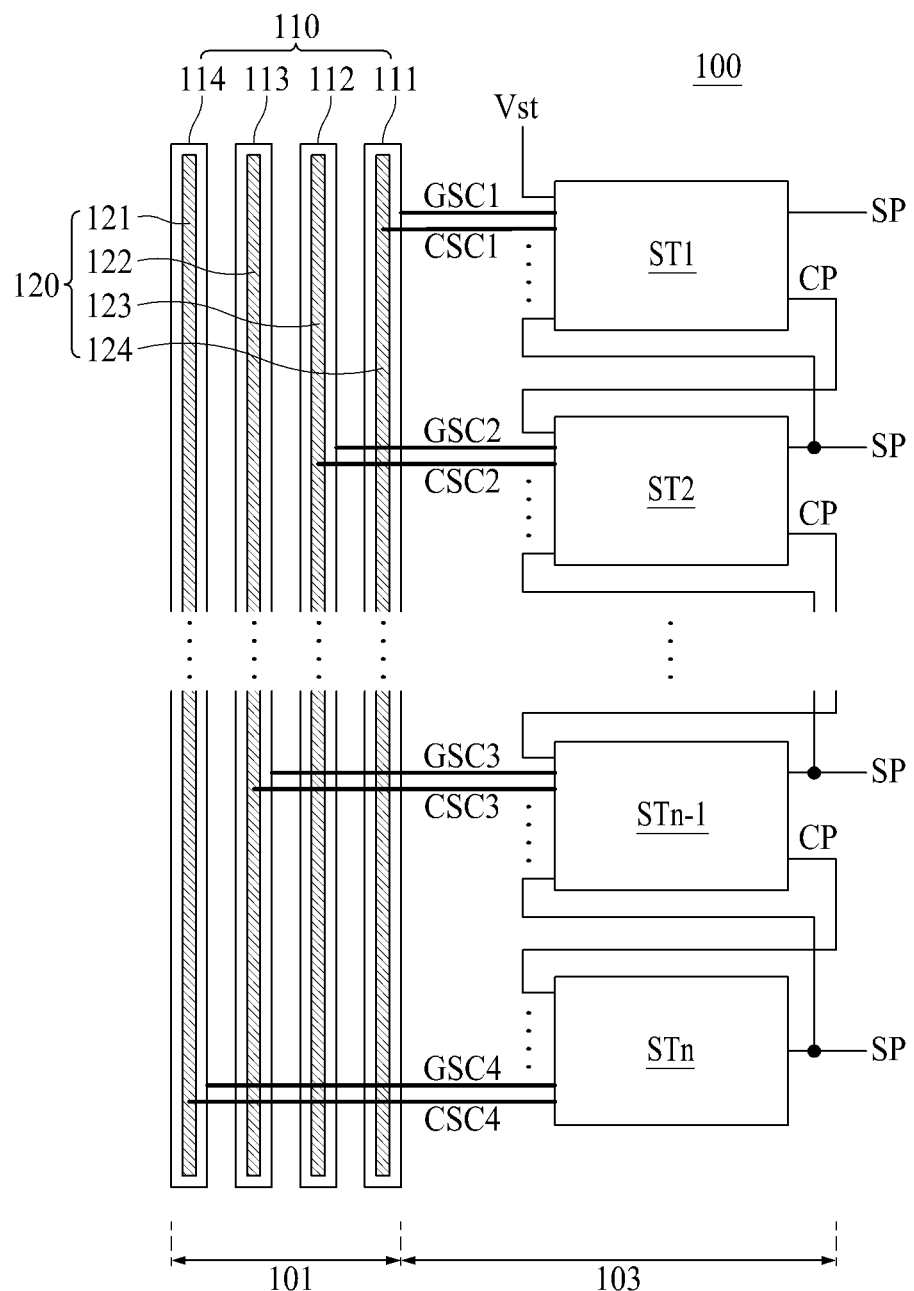
FIG. 1 is a diagram for describing a shift register according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of a shift register and a display device including the same according to the present disclosure will be described in detail with reference to the accompanying drawings. All the components of the shift register and the display device including the shift register according to all embodiments of the present disclosure are operatively coupled and configured. Further in the specification, in adding reference numerals for elements in each drawing, it should be noted that like reference numerals already used to denote like elements in other drawings are used for elements wherever possible.

FIG. 1 is a diagram for describing a shift register 100 according to an embodiment of the present disclosure.

Referring to FIG. 1, the shift register 100 according to an embodiment of the present disclosure may include j (where j is a natural number equal to or more than two) number of gate shift clock lines 111 to 114, k (where k is a natural number equal to or less than j) number of carry shift clock lines 121 to 124, and n number of stages ST1 to STn (where n is a positive integer, e.g., preferably two or more). Hereinafter, the j gate shift clock lines 111 to 114 may be referred to as gate shift clock lines 110, and the k carry shift clock lines 121 to 124 may be referred to as carry shift clock lines 120.

The gate shift clock lines 110 may be provided on a clock line part 101 defined on a substrate and may be arranged at certain intervals in parallel, and a lengthwise direction of each of the gate shift clock lines 110 may be parallel to a first lengthwise direction of the substrate, for example, a short side lengthwise direction.

The gate shift clock lines 110 may respectively receive j number of gate shift clocks GSC1 to GSC4 (clock signals) supplied from the outside. Each of the j gate shift clocks GSC1 to GSC4 may alternately and repeatedly have a high period corresponding to a high voltage level enabling a transistor to be turned and a low period corresponding to a low voltage level enabling a transistor to be turned off, at a certain period. A phase of each of the j gate shift clocks GSC1 to GSC4 may be shifted by units of one horizontal period of a display panel, but may be variously set without being limited thereto.

The carry shift clock lines 120 may respectively overlap the gate shift clock lines 110 in a one-to-one relationship. That is, each of the carry shift clock lines 120 may overlap a corresponding gate shift clock line of the gate shift clock lines 110 with an insulator therebetween.

The carry shift clock lines 120 may respectively receive corresponding carry shift clocks CSC1 to CSC4 (clock signals) supplied from the outside. Each of the carry shift clocks CSC1 to CSC4 may alternately and repeatedly have the high period corresponding to a high voltage level enabling a transistor to be turned and the low period corresponding to a low voltage level enabling the transistor to be turned off, at a certain period. A phase of each of gate shift clocks GSC1 to GSC4 may be shifted by units of one horizontal period of a display panel, but may be variously set without being limited thereto.

The carry shift clocks CSC1 to CSC4 and the gate shift clocks GSC1 to GSC4 according to an embodiment may have the same phase. Here, the same phase may be defined as that a rising time when the low period is shift to the high period is substantially the same.

The carry shift clocks CSC1 to CSC4 and the gate shift clocks GSC1 to GSC4 according to an embodiment may have the same phase, but may have the same voltage level or different voltage levels. For example, a low voltage level of each of the gate shift clocks GSC1 to GSC4 may be equal to or lower than that of each of the carry shift clocks CSC1 to CSC4, and a high voltage level of each of the gate shift clocks GSC1 to GSC4 may be equal to or higher than that of each of the carry shift clocks CSC1 to CSC4.

The gate shift clock lines 110 and the carry shift clock lines 120 according to an embodiment may include the same metal material or different metal materials. For example, the gate shift clock lines 110 may include a first metal material, and the carry shift clock lines 120 may include a second metal material different from the first metal material and may be provided on an insulation layer covering the gate shift clock lines 110.

The gate shift clock lines 110 and the carry shift clock lines 120 which overlap each other may have different widths. For example, the gate shift clock lines 110 may have a first width, and the carry shift clock lines 120 may have a second width which is narrower than the first width. Here, the gate shift clock lines 110 may be used as a scan pulse SP which is output to the outside through the stage, and thus, may have the first width which is relatively wide, in order to enhance voltage stability and minimize voltage drop. Also, the carry shift clock lines 120 may be used between stages in the shift register 100 without being output to the outside of the shift register 100, and thus, may not have the same width as that of each of the gate shift clock lines 110. Therefore, the gate shift clock lines 110 may be provided on the insulation layer to have the second width narrower than the carry shift clock lines 120 and to overlap the carry shift clock lines 120, but do not affect an operation of a circuit.

Each of the n stages ST1 to STn may be provided on a shift register unit 103 defined on the substrate, and one of the gate shift clock lines 110 may be electrically connected to one of the carry shift clock lines 120. Each of the n stages ST1 to STn may output a gate shift clock GSC, supplied from one of the gate shift clock lines 110, as the scan pulse SP and may output a carry shift clock CSC, supplied from one of the carry shift clock lines 120, as a carry pulse CP. That is, each of the n stages ST1 to STn may be dependently driven according to a gate start pulse Vst to output the scan pulse SP and the carry pulse CP in a predetermined order. Here, the gate start signal Vst may be supplied to a first stage ST1. Each of second to nth stages ST2 to STn may be supplied with the carry pulse CP, output from a stage previous thereto, as the gate start signal Vst. Also, each of first to n−1st stages ST1 to STn−1 may be supplied with the scan pulse SP, output from a stage next thereto, as a reset signal.

An internal configuration of each of the n stages ST1 to STn can be the same as that of a stage disclosed in Korean Patent Publication No. 10-2014-0020391, and thus, its detailed description is omitted. Furthermore, the n stages ST1 to STn may have the same phase like the gate shift clocks and the carry shift clocks according to the present embodiment, and may be changed to a stage which the scan pulse and the carry pulse by using two or more gate shift clocks and one or more carry shift clocks.

For example, the n stages ST1 to STn according to an embodiment of the present disclosure may be changed to a stage disclosed in Korean Patent Publication No. 10-2015-0040750 or Korean Patent Publication No. 10-2015-0126286, and thus, the shift register according to an embodiment of the present disclosure may include the stage disclosed in the documents.

Therefore, the n stages ST1 to STn according to an embodiment of the present disclosure may be changed to a stage applied to a liquid crystal display panel or a light emitting display panel so as to simultaneously output a first clock pulse and a second clock pulse by using gate shift clocks and carry shift clocks which have the same phase and have the same voltage level or different voltage levels.

In the shift register 10 according to the present embodiment, the gate shift clock lines 110 may overlap the carry shift clock lines 120, and thus, a size or a width of the clock line part is reduced. For example, when each of the gate shift clock lines 110 and the carry shift clock lines 120 is provided as six, a width of one gate shift clock line is 150 μm, a width of one carry shift clock line is 100 μm, and an interval between adjacent clock lines is 20 μm, a total width of the clock line part according to an embodiment of the present disclosure is reduced by about 0.7 mm.

Figure 2:
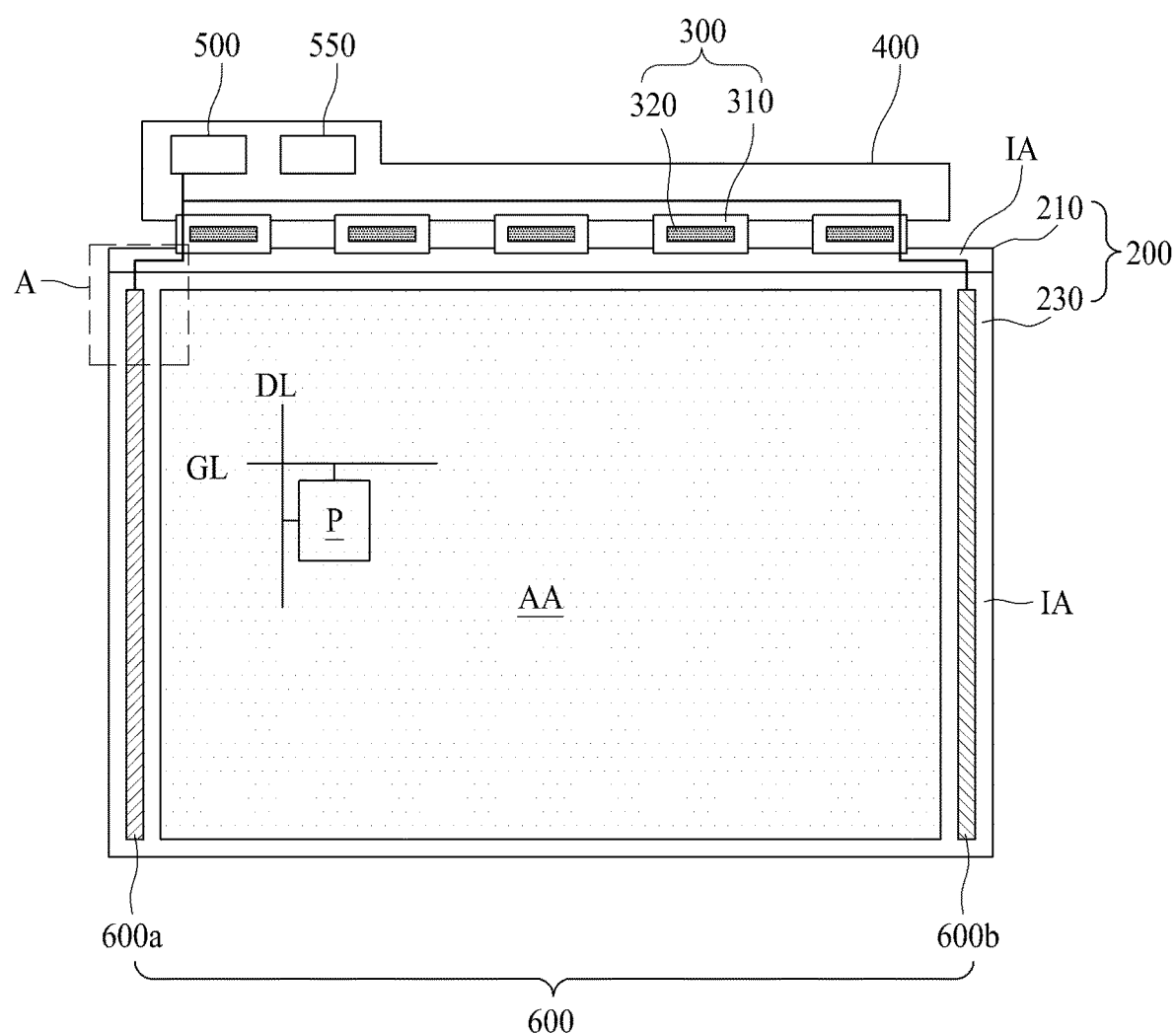
FIG. 2 is a diagram for describing a display device according to an embodiment of the present disclosure.
Figure 3:
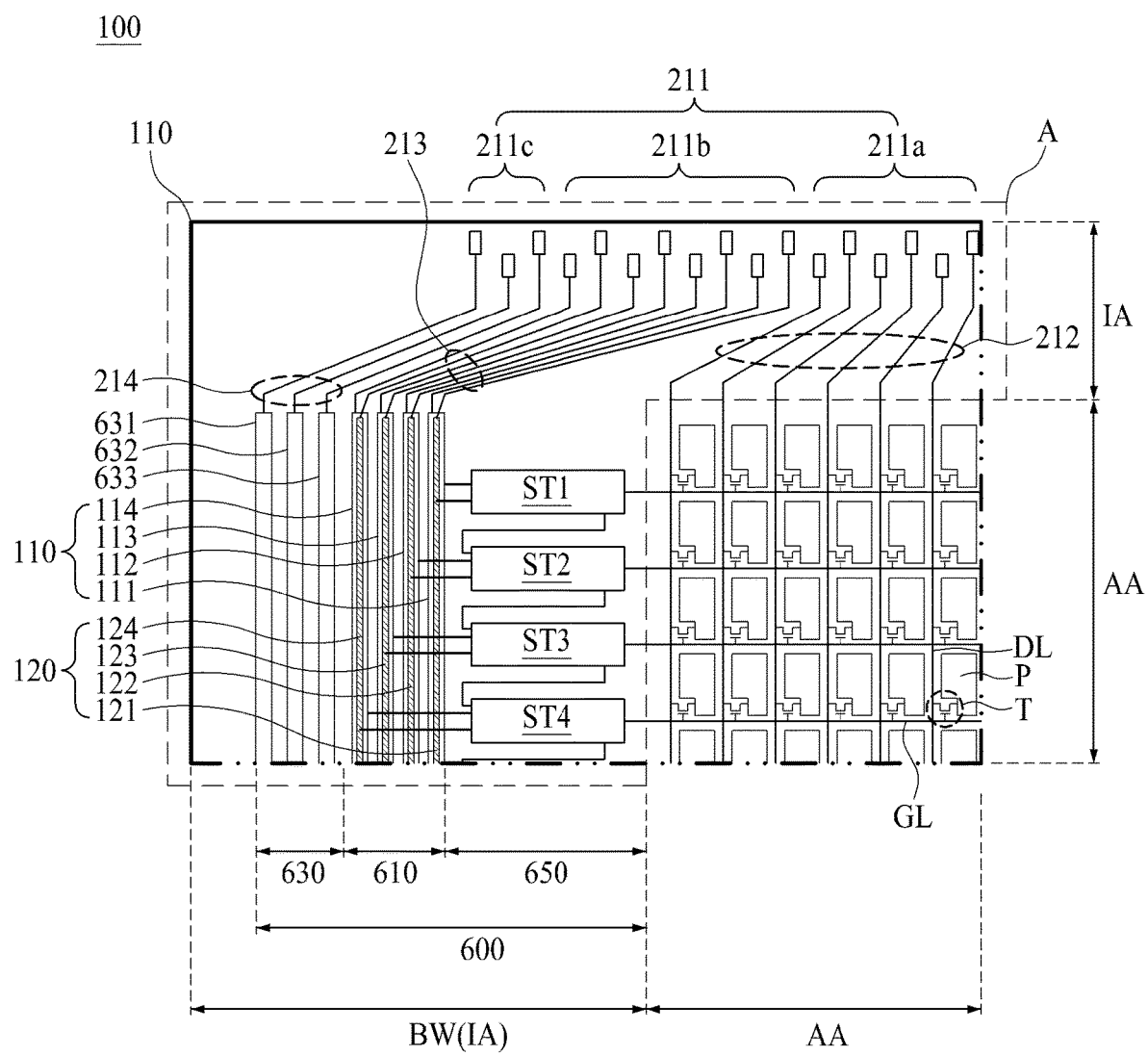
FIG. 3 is an enlarged view of a portion A illustrated in FIG. 2.

FIG. 2 is a diagram for describing a display device according to an embodiment of the present disclosure, and FIG. 3 is an enlarged view of a portion A illustrated in FIG. 2.

Referring to FIGS. 2 and 3, the display device according to the present embodiment may include a display panel 200, a plurality of data drivers 300, a printed circuit board (PCB) 400, a timing controller 500, and a gate driver 600.

The display panel 200 may include a first substrate 210 and a second substrate 230 which are opposite-bonded to each other.

The first substrate 210 may include a display area (or an active area) AA, including a plurality of pixels P respectively provided in a plurality of pixel areas defined by intersections of a plurality of gate lines GL and a plurality of data lines DL, and a non-display area (or an inactive area) IA provided near the display area AA.

The plurality of pixels P may each include a pixel cell which displays an image according to a scan pulse supplied through an adjacent gate line GL and a data signal supplied through an adjacent data line DL. In this case, the pixel cell may include at least one thin film transistor (TFT) T and at least one capacitor, and may display an image through driving of liquid crystal according to the data signal or may display an image through emission of light from an electron light-emitter based on the data signal. Here, the electron light-emitter may be an organic light-emitter, a quantum dot light-emitter, or an inorganic light-emitter including a quantum dot light-emitter.

The first substrate 210 may include a plurality of pad parts 211 provided in one side of the non-display area 1A.

The plurality of pad parts 211 may be arranged at certain intervals in the one side of the non-display area 1A. At least one of a first pad part and a last pad part of the plurality of pad parts 211 may include a data pad area 211a, a gate pad area 211b, and a gate power pad area 211c, and the other pad parts may each include only the data pad area 211a.

The data pad area 211a may include a plurality of pads which are connected to corresponding data lines DL through data link lines 212 in a one-to-one relationship.

The gate pad area 211b may include a gate pad part which includes k number of carry clock pads and j number of gate clock pads connected to the gate driver 400 through clock link lines 213.

The gate power pad area 211c may include a plurality of gate power pads connected to the gate driver 400 through gate power link lines 214.

The second substrate 230 may cover a whole portion of the first substrate 210 other than the non-display area IA. In this case, if each of the pixels P includes a liquid crystal cell or a pixel cell emitting white light, a color filter layer overlapping each pixel P may be provided on the second substrate 230.

The plurality of data drivers 300 may be attached on the plurality of pad parts 211 provided on the first substrate 210 of the display panel 200 and may supply data signals to the plurality of data lines DL. To this end, the plurality of data drivers 300 according to an embodiment may each include a data flexible circuit film 310 and a data driving integrated circuit (IC) 330.

The data flexible circuit film 310 may be attached on the plurality of pad parts 211 through a film attachment process.

The data driving IC 330 may be mounted on the data flexible circuit film 310. The data driving IC 330 may convert pixel data into an analog data signal by using a data control signal and pixel data input through the data flexible circuit film 310 and a plurality of reference gamma voltages, and may supply the analog data signal to a corresponding data line DL through the data flexible circuit film 310, a plurality of data pads, and a plurality of data link lines.

The PCB 400 may be connected to the data flexible circuit film 310 of each of the plurality of data drivers 300 in common. The timing controller 500, a user connector, and a power generator 550 may be mounted on the PCB 400. The PCB 400 may transfer video data and a timing sync signal, supplied from an external display driving system through the user connector, to the timing controller 500 and may transfer an input power, input through the user connector, to the power generator 550.

The timing controller 500 may receive the video data and the timing sync signal transferred through the PCB 400, align the video data according to a pixel structure of the display panel 200 to generate pixel data, based on the timing sync signal and generate the data control signal, based on the timing sync signal. The pixel data and the data control signal may be supplied to a corresponding data driving IC 330 through the PCB 400 and the data flexible circuit film 310.

The timing controller 500 may generate a gate control signal including a gate start signal, j number of gate shift clocks, and k number carry shift clocks, based on the timing sync signal. The gate control signal may be supplied to the gate driver 600 through the PCB 400, first and last data flexible circuit films 310, and the first substrate 210.

The power generator 550 may generate the plurality of reference gamma voltages having different voltage levels from the input power. Also, the power generator 550 may generate a common voltage, a high level voltage, a low level voltage, and a driving voltage from the input power and may supply each of the generated voltages to an element requiring a corresponding voltage.

The gate driver 600 may be provided in the non-display area IA of the first substrate 210 so as to be connected to the plurality of gate lines GL in a one-to-one relationship and may be connected to the clock link lines 213, a plurality of gate pads, the gate power link lines 214, and the plurality of gate power pads. The gate driver 600 may supply the scan pulse to a gate line GL corresponding to a predetermined order, based on the gate control signal supplied from the timing controller 500 and a gate driving voltage supplied from the PCB 400. At this time, the gate control signal may be supplied to the gate driver 600 through the plurality of gate pads, and the gate driving voltage may be supplied to the gate driver 600 through the plurality of gate power pads.

The gate driver 600 according to an embodiment may include first and second gate driving circuits 600a and 600b. Here, one of the first and second gate driving circuits 600a and 600b may be omitted.

The first gate driving circuit 600a may be provided in a left non-display area IA of the first substrate 210 and may be connected to one end of each of the plurality of gate lines GL in a one-to-one relationship.

The second gate driving circuit 600b may be provided in a right non-display area IA of the first substrate 210 and may be connected to the other end of each of the plurality of gate lines GL in a one-to-one relationship.

The first and second gate driving circuits 600a and 600b may each include a clock line part 610, a power line part 630, and a stage unit 650.

The clock line part 610 may include j number of gate shift clock lines 111 to 114 and k number of carry shift clock lines 121 to 124 and is the same as the illustration of FIG. 1, and thus, its detailed description is omitted.

Each of the j gate shift clock lines 111 to 114 may be electrically connected to a corresponding gate pad through j number of gate clock link lines of the clock link lines 213.

Each of the k carry shift clock lines 121 to 124 may be electrically connected to a corresponding gate pad through k number of carry clock link lines of the clock link lines 213.

The power line part 630 may include a plurality of power supply lines 631, 633, and 635 which are separated from the clock line part in a direction toward an end of the first substrate 210 and are provided in parallel with the carry shift clock line. Each of the plurality of power supply lines 631, 633, and 635 may be electrically connected to a corresponding gate power pad through a corresponding gate power link line 214.

The stage unit 650 may include n number of stages ST1 to ST4 and . . . connected to one of the gate shift clock lines 110, one of the carry shift clock lines 120, and the plurality of power supply lines 631, 633, and 635. Each of then stages ST1 to ST4 and . . . may include a plurality of oxide TFTs including an oxide semiconductor layer which is provided on the first substrate 210 at the same time with a process of forming the TFT T of each pixel P. An internal configuration of each of the n stages ST1 to ST4 and . . . may be the same as that of the stage disclosed in Korean Patent Publication No. 10-2014-0020391, or may be changed to that of the stage disclosed in Korean Patent Publication No. 10-2015-0040750 or Korean Patent Publication No. 10-2015-0126286. Thus, descriptions disclosed in the documents are applied to a detailed configuration and operation of each of then stages ST1 to ST4 and . . . .

Figure 4:
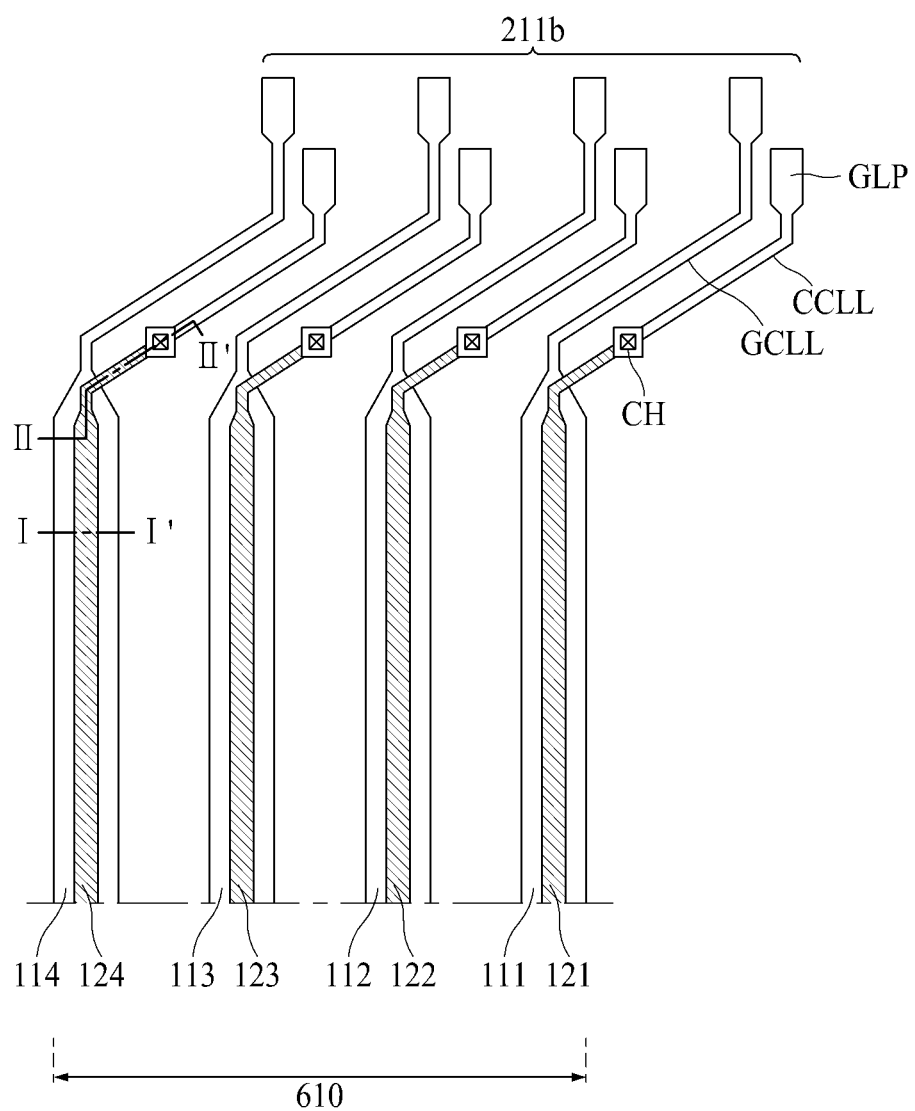
FIG. 4 is a diagram for describing a connection structure between a clock line, a link line, and a stage illustrated in FIG. 3.
Figure 5:
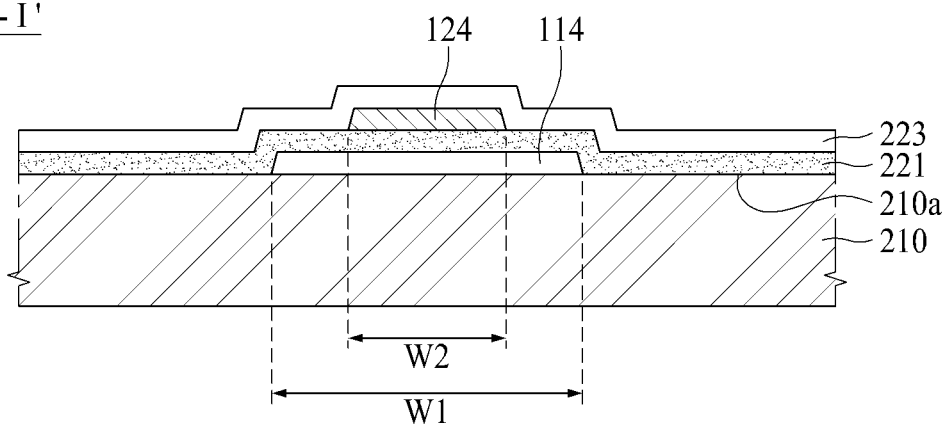
FIG. 5 is a cross-sectional view taken along line I-I' illustrated in FIG. 4.
Figure 6:
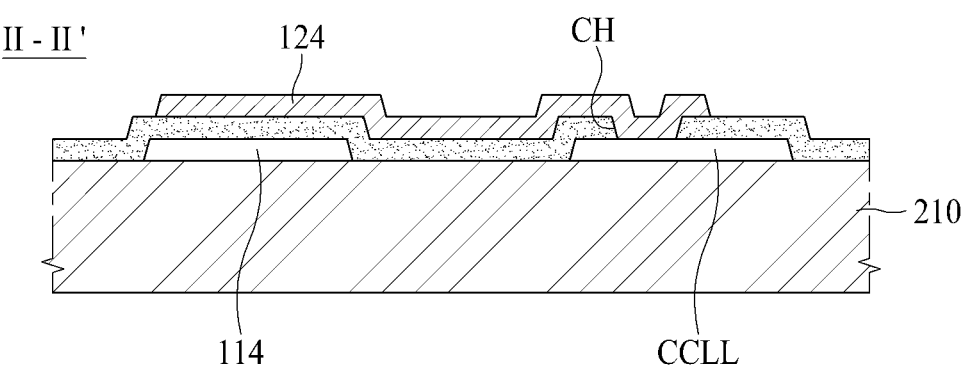
FIG. 6 is a cross-sectional view taken along line II-II' illustrated in FIG. 4.

FIG. 4 is a diagram for describing a connection structure between a clock line, a link line, and a stage illustrated in FIG. 3, FIG. 5 is a cross-sectional view taken along line I-I' illustrated in FIG. 4, and FIG. 6 is a cross-sectional view taken along line II-II' illustrated in FIG. 4.

Referring to FIGS. 4 to 6, the j gate shift clock lines 111 to 114 according to an embodiment may be provided on an upper surface 210a of the first substrate 210 and may be arranged at certain intervals in parallel to each have a first width W1. The clock link lines 213 corresponding thereto may be provided on the upper surface 210a of the first substrate 210, and each of the j gate clock link lines of the clock link lines 213 may electrically connect an upper end of a corresponding gate shift clock line of the j gate shift clock lines 111 to 114 and a gate pad GLP. In this case, the j gate shift clock lines 111 to 114 and the j gate clock line lines 213 may be provided on the same layer.

Each of the j gate shift clock lines 111 to 114 may be connected to a first pull-up TFT which is provided in a corresponding stage ST to extend from a portion of one surface to the stage unit 650. Here, the first pull-up TFT may output the gate shift clock, supplied through a corresponding gate shift clock line of the j gate shift clock lines 111 to 114, as the scan pulse according to a voltage of a first node.

Each of the j gate shift clock lines 111 to 114 according to an embodiment may be formed of a gate electrode material of a TFT and may be covered by a gate insulation layer 221.

The k carry shift clock lines 121 to 124 may be respectively provide on the gate insulation layer 221 to overlap the j gate shift clock lines 111 to 114 in a one-to-one relationship. That is, each of the k carry shift clock lines 121 to 124 and each of the j gate shift clock lines 111 to 114 may be disposed upward and downward with the gate insulation layer 221.

The k carry shift clock lines 121 to 124 according to an embodiment may be formed of a source/drain electrode material of the TFT and may be covered by an interlayer dielectric 223.

An upper end of each of the k carry shift clock lines 121 to 124 may extend to overlap a corresponding carry clock link line of k carry clock link lines CCLL of the clock link lines 213 and may be electrically connected to a corresponding carry clock link line CCLL through a contact hole CH provided in the gate insulation layer 221.

Moreover, each of the k carry shift clock lines 121 to 124 may be connected to a second pull-up TFT which is provided in a corresponding stage ST to extend from a portion of one surface to the stage unit 650. Here, the second pull-up TFT may output the carry shift clock, supplied through a corresponding carry shift clock line of the k carry shift clock lines 121 to 124, as the carry pulse according to the voltage of the first node.

Optionally, the k carry shift clock lines 121 to 124 and the k carry clock link lines may be connected to each other through a bridge line without being directly connected to each other through the contact hole CH. The bridge line may be provided on the same layer as a pad, connected to an upper end of each of the k carry shift clock lines 121 to 124 through a first bridge contact hole overlapping the upper end of each of the k carry shift clock lines 121 to 124, and connected to a lower end of a carry clock link line through a second bridge contact hole overlapping the lower end of the carry clock link line. As a result, electrical connections between the k carry shift clock lines 121 to 124 and the k carry clock link lines according to the present embodiment may be changed so as to be provided at the same time with a process of forming the pixels without an additional process.

Optionally, in FIGS. 5 and 6, it is described that each of the gate shift clock lines is formed of the gate electrode material of the TFT and each of the carry shift clock lines is formed of the source/drain electrode material of the TFT, but the present embodiment is not limited thereto. In other embodiments, each of the gate shift clock lines and each of the carry shift clock lines may be selected from different metal layers which are provided on different layers with at least one insulation layer.

Optionally, in FIGS. 1, 3, and 4, four gate shift clock lines and four carry shift clock lines are illustrated, but are not limited thereto. In other embodiments, the number of gate shift clock lines and the number of carry shift clock lines may be changed depending on an internal circuit configuration of a stage. For example, the number of gate shift clock lines may be larger than the number of carry shift clock lines, and in this case, a width of at least one other gate shift clock line which does not overlap the carry shift clock lines may be the same as or different from that of another gate shift clock line overlapping the carry shift clock lines. On the other hand, the number of carry shift clock lines may be larger than the number of gate shift clock lines, and in this case, a width of at least one other carry shift clock line which does not overlap the gate shift clock lines may be the same as or different from that of another carry shift clock line overlapping the gate shift clock lines.

Figure 7:
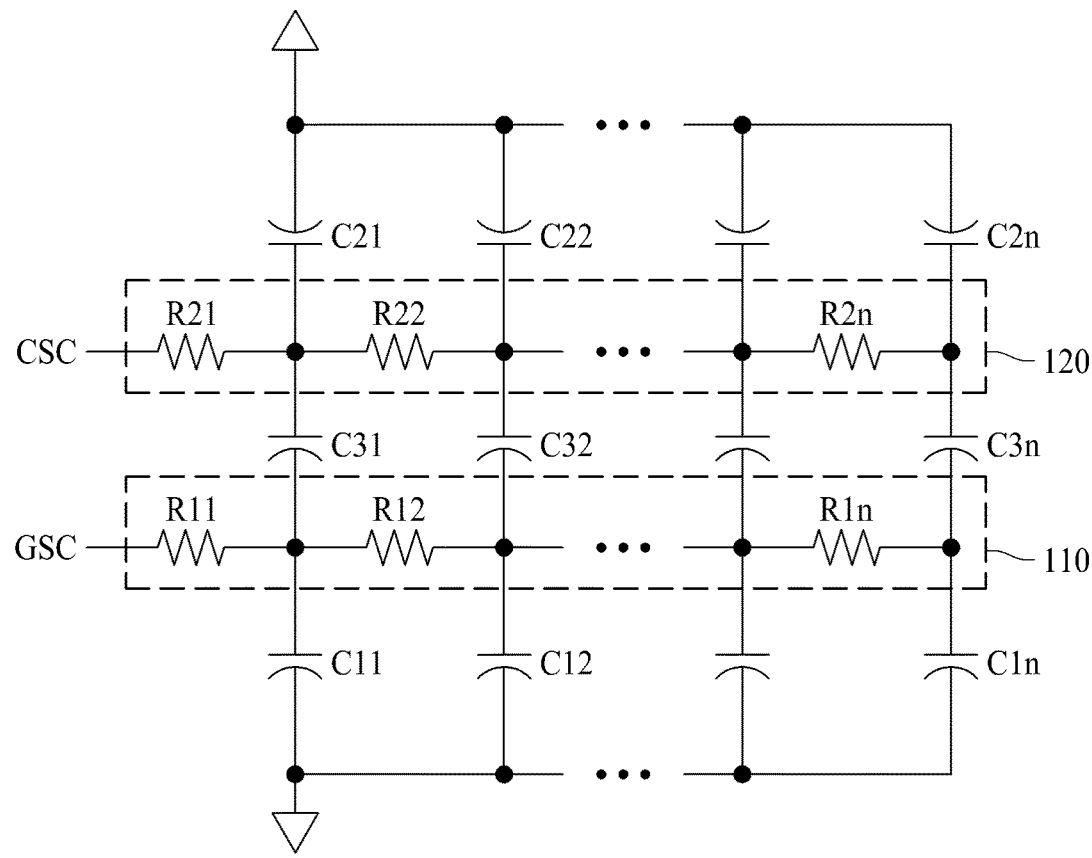
FIG. 7 is an equivalent circuit diagram of a gate shift clock line and a carry shift clock line according to an embodiment of the present disclosure.
Figure 8:
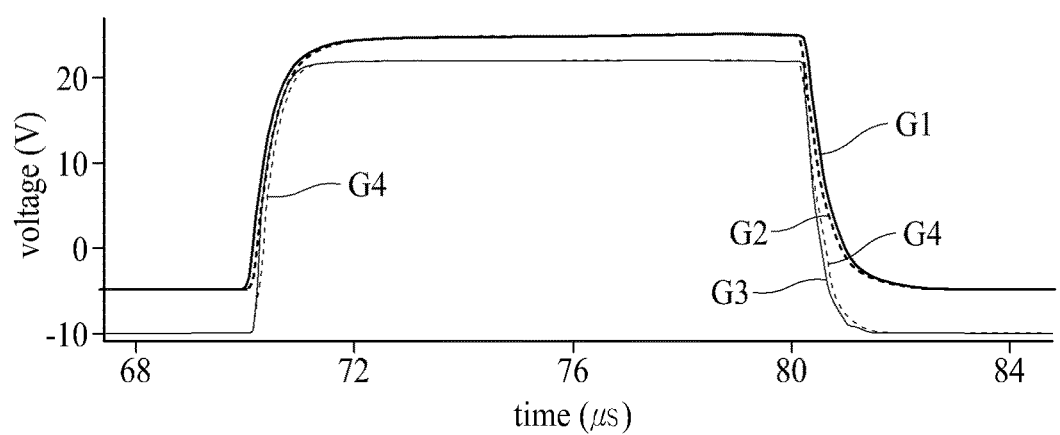
FIG. 8 is a waveform diagram of a gate shift clock and a carry shift clock using the equivalent circuit diagram of FIG. 7.

FIG. 7 is an equivalent circuit diagram of a gate shift clock line and a carry shift clock line according to an embodiment of the present disclosure, and FIG. 8 is a waveform diagram of a gate shift clock and a carry shift clock using the equivalent circuit diagram of FIG. 7.

Referring to FIGS. 7 and 8, a gate shift clock line 110 may include a plurality of first resistors $R11$ to $R1n$, electrically and serially connected to each other, and a plurality of first capacitances $C11$ to $C1n$ electrically connected to the plurality of first resistors $R11$ to $R1n$ in parallel. Also, a carry shift clock line 120 may include a plurality of second resistors $R21$ to $R2n$, electrically and serially connected to each other, and a plurality of second capacitances $C21$ to $C2n$ electrically connected to the plurality of second resistors $R21$ to $R2n$ in parallel. Therefore, a rising period and a falling period of a gate shift clock GSC applied to the gate shift clock line 110 are affected by an RC load based on the plurality of first resistors $R11$ to $R1n$ and the plurality of first capacitances $C11$ to $C1n$. Also, a rising period and a falling period of a carry shift clock CSC applied to the carry shift clock line 120 are affected by an RC load based on the plurality of second resistors $R21$ to $R2n$ and the plurality of second capacitances $C21$ to $C2n$.

The gate shift clock line 110 and the carry shift clock line 120 may overlap each other with an insulation layer therebetween, and thus, a plurality of third capacitances $C31$ to $C3n$ may be provided in the gate shift clock line 110 and the carry shift clock line 120.

The plurality of first resistors $R11$ to $R1n$ and the plurality of second resistors $R21$ to $R2n$ may differ depending on a material of a corresponding clock line, and the plurality of first capacitances $C11$ to $C1n$ and the plurality of second capacitances $C21$ to $C2n$ may differ depending on a material of a corresponding clock line.

Therefore, the gate shift clock line 110 and the carry shift clock line 120 may have different transmission speeds with respect to corresponding clock signals GSC and CSC.

However, in an embodiment of the present disclosure, the gate shift clock GSC supplied to the gate shift clock line 110 and the carry shift clock CSC supplied to the carry shift clock line 120 may have the same phase, and thus, transmission speeds of the gate shift clock GSC and the carry shift clock CSC increase according to a coupling effect based on the plurality of third capacitances $C31$ to $C3n$. In this case, when a difference between an RC load of the gate shift clock GSC and an RC load of the carry shift clock CSC is large, a transmission speed of a clock increases. Accordingly, the gate shift clock GSC supplied to the gate shift clock line 110 has a rising and falling speed which increases up to a specific voltage.

Therefore, referring to FIG. 8, it can be seen that a waveform G1 of the gate shift clock according to the present embodiment has a transmission speed equal to or higher than that of a waveform G2 of a related art gate shift clock. Also, it can be seen that a waveform G3 of the carry shift clock according to the present embodiment has a transmission speed equal to or higher than that of a waveform G4 of a related art carry shift clock.

As a result, in the shift register according to the present embodiment, the gate shift clock line 110 and the carry shift clock line 120 may overlap each other with the insulation layer therebetween, and thus, the size or width of the clock line part is reduced, thereby decreasing a bezel width (BW) of a display device.

As described above, according to the embodiments of the present disclosure, the shift register where the size of the clock line part is reduced is provided, and since the size of the shift register is reduced, the display device having a thin bezel width is provided.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A shift register comprising:
   j number of gate shift clock lines arranged in parallel, where j is a natural number equal to or greater than two;
   k number of carry shift clock lines arranged in parallel, where k is a natural number equal to or less than j; and
   n number of stages configured to output a gate shift clock signal, supplied through one of the j gate shift clock lines, as a scan pulse, and to output a carry shift clock signal, supplied through one of the k carry shift clock lines, as a carry pulse, where n is a positive integer
   wherein the k carry shift clock lines overlap the j gate shift clock lines.

2. The shift register of claim 1, wherein a gate shift clock signal and a carry shift clock signal, which are respectively supplied to the j gate shift clock lines and the k carry shift clock lines overlapping each other, have a same phase.

3. The shift register of claim 1, wherein a gate shift clock signal and a carry shift clock signal, which are respectively supplied to the j gate shift clock lines and the k carry shift clock lines overlapping each other, have a same phase and different voltage levels.

4. The shift register of claim 1, wherein:
   each of the j gate shift clock lines comprises a first metal material, and
   each of the k carry shift clock lines comprises a second metal material different from the first metal material of the j gate shift clock lines.

5. The shift register of claim 1, wherein the j gate shift clock lines and the k carry shift clock lines overlapping each other have different widths.

6. The shift register of claim 1, wherein:
   each of the j gate shift clock lines has a first width, and
   each of the k carry shift clock lines has a second width different from the first width.

7. The shift register of claim 1, wherein each of the k carry shift clock lines is provided on an insulation layer covering all of the j gate shift clock lines, and has a width which is narrower than each of the j gate shift clock lines.

8. A display device comprising:
   a display panel including a display area and a non-display area surrounding the display area, the display area including a plurality of pixels respectively provided in a plurality of pixel areas defined by intersections of a plurality of gate lines and a plurality of data lines;
   a gate driving circuit configured to supply a scan pulse to each of the plurality of gate lines; and
   a data driving circuit configured to respectively supply data voltages to the plurality of data lines,
   wherein the gate driving circuit includes the shift register of claim 1.

9. The display device of claim 8, wherein the non-display area of the display panel comprises:
   j number of gate clock pads;
   k number of carry clock pads;
   j number of gate clock link lines connecting the j gate clock pads to the j gate shift clock lines in a one-to-one relationship; and
   k number of carry clock link lines connecting the k carry clock pads to the k carry shift clock lines in a one-to-one relationship.

10. The display device of claim 9, wherein:
    the j gate shift clock lines and the j gate clock link lines are provided on a same layer and are directly connected to each other, and
    the k carry shift clock lines and the k carry clock link lines are provided on different layers and are connected to each other through a contact hole.

* * * * *